(12) United States Patent
Dubois

(10) Patent No.: US 10,558,169 B2
(45) Date of Patent: Feb. 11, 2020

(54) METHOD FOR MANUFACTURING A MICROMECHANICAL TIMEPIECE PART AND SAID MICROMECHANICAL TIMEPIECE PART

(71) Applicant: Nivarox-FAR S.A., Le Locle (CH)

(72) Inventor: Philippe Dubois, Marin (CH)

(73) Assignee: Nivarox-FAR S.A., Le Locle (CH)

( * ) Notice: Subject to any disclaimer, the term of this patent is extended or adjusted under 35 U.S.C. 154(b) by 0 days.

(21) Appl. No.: 15/231,951

(22) Filed: Aug. 9, 2016

(65) Prior Publication Data
US 2017/0068215 A1 Mar. 9, 2017

(30) Foreign Application Priority Data

Sep. 8, 2015 (EP) ..................................... 15184184

(51) Int. Cl.
*G04B 15/14* (2006.01)
*B81C 1/00* (2006.01)
(Continued)

(52) U.S. Cl.
CPC .............. *G04B 15/14* (2013.01); *B81B 3/007* (2013.01); *B81C 1/0038* (2013.01);
(Continued)

(58) Field of Classification Search
CPC ...... G04B 15/14; B81B 3/007; G04D 3/0069; G04D 3/003; G04D 3/0033; B81C 1/0038;
(Continued)

(56) References Cited

U.S. PATENT DOCUMENTS 8,992,784 B2 * 3/2015 Karapatis ............ B81C 1/00682
216/2
2005/0023629 A1 * 2/2005 Ding ....................... B81B 7/007
257/414

(Continued)

FOREIGN PATENT DOCUMENTS

DE 10 2013 113 380 B3 4/2015
WO WO 2007/000271 A1 1/2007
WO WO 2012/152843 A1 11/2012

OTHER PUBLICATIONS

European Search Report dated Mar. 2, 2016 in European Application 15184184, filed on Sep. 8, 2015 ( with English Translation of categories of Cited Documents).

*Primary Examiner* — Anita K Alanko
(74) *Attorney, Agent, or Firm* — Oblon, McClelland, Maier & Neustadt, L.L.P.

(57) ABSTRACT

A method for manufacturing a micromechanical timepiece part starting from a silicon-based substrate, including, forming pores on the surface of at least one part of a surface of said silicon-based substrate of a determined depth, entirely filling the pores with a material chosen from diamond, diamond-like carbon, silicon oxide, silicon nitride, ceramics, polymers and mixtures thereof, in order to form, in the pores, a layer of the material of a thickness at least equal to the depth of the pores. A micromechanical timepiece part including a silicon-based substrate which has, on the surface of at least one part of a surface of the silicon-based substrate, pores of a determined depth, the pores being filled entirely with a layer of a material chosen from diamond, diamond-like carbon, silicon oxide, silicon nitride, ceramics, polymers and mixtures thereof, of a thickness at least equal to the depth of the pores.

10 Claims, 1 Drawing Sheet

(51) Int. Cl.
*B81B 3/00* (2006.01)
*G04D 3/00* (2006.01)
*C23C 14/06* (2006.01)
*C23C 16/02* (2006.01)
*C23C 14/10* (2006.01)
*C23C 14/12* (2006.01)
*C09K 13/00* (2006.01)
*C09K 13/08* (2006.01)
*C25F 3/12* (2006.01)
*C23C 16/455* (2006.01)
*C25F 3/02* (2006.01)

(52) U.S. Cl.
CPC ...... *B81C 1/00539* (2013.01); *B81C 1/00547* (2013.01); *G04D 3/003* (2013.01); *G04D 3/0033* (2013.01); *G04D 3/0069* (2013.01); *B81C 1/00714* (2013.01); *B81C 1/00992* (2013.01); *B81C 2201/0115* (2013.01); *C09K 13/00* (2013.01); *C09K 13/08* (2013.01); *C23C 14/0611* (2013.01); *C23C 14/0652* (2013.01); *C23C 14/10* (2013.01); *C23C 14/12* (2013.01); *C23C 16/0254* (2013.01); *C23C 16/45525* (2013.01); *C25F 3/02* (2013.01); *C25F 3/12* (2013.01)

(58) Field of Classification Search
CPC ............ B81C 1/00539; B81C 1/00547; B81C 1/00714; B81C 1/00992; B81C 2201/0115; B81C 2201/035; C09K 13/00; C09K 13/08; C25F 3/02; C25F 3/12; C23C 16/0254; C23C 16/45525; C23C 14/10; C23C 14/12; C23C 14/0611; C23C 14/0652
See application file for complete search history.

(56) References Cited

U.S. PATENT DOCUMENTS

| | | | |
|---|---|---|---|
| 2005/0139542 A1* | 6/2005 | Dickensheets | B81B 3/007 210/490 |
| 2009/0236610 A1* | 9/2009 | Lammel | H01L 21/223 257/77 |
| 2010/0214880 A1 | 8/2010 | Rappo et al. | |
| 2014/0033848 A1* | 2/2014 | Cusin | B81C 99/0085 74/457 |
| 2015/0050556 A1* | 2/2015 | Liu | C09K 13/08 429/218.1 |
| 2017/0068218 A1* | 3/2017 | Dubois | G04B 31/08 |
| 2017/0068219 A1* | 3/2017 | Dubois | G04B 31/08 |
| 2017/0068221 A1* | 3/2017 | Dubois | G04B 45/0076 |

* cited by examiner

METHOD FOR MANUFACTURING A MICROMECHANICAL TIMEPIECE PART AND SAID MICROMECHANICAL TIMEPIECE PART

This application claims priority from European Patent application 15184184.8 of Sep. 8, 2015, the entire disclosure of which is hereby incorporated herein by reference.

FIELD OF THE INVENTION

The present invention relates to a method for producing silicon-based, reinforced micromechanical timepiece parts. The invention relates likewise to a silicon-based, reinforced micromechanical timepiece part, in particular being able to be obtained by such a method.

BACKGROUND OF THE INVENTION

Silicon is a material which is used more and more in the manufacture of micromechanical timepiece parts, in particular parts which remain connected to a silicon-based substrate on which they have been machined.

With respect to the metals or alloys which are used as standard for manufacturing micromechanical timepiece parts, such as toothed wheels, or components of the escapement, silicon has numerous advantages. It is a very hard material of very light weight which makes it therefore possible for it to have very reduced inertia and consequently to improve the efficiency. Silicon likewise makes it possible to produce complex or monobloc parts.

In order to improve or modify the properties of the silicon, it is known to deposit a layer of a suitable material over the silicon. Thus, in order to improve its tribological properties, diamond is deposited on the silicon, for example by a method of thin-film vapour phase deposition (CVD/PVD).

However these methods have a deposition rate which can prove to be too slow when the thickness of the deposited layer exceeds a few microns. In fact, the deposition rates in CVD machines for example being typically of the order of ten nanometres/minute, this technique is not generally used for the manufacture of a layer greater than a few microns.

It is therefore necessary to propose a method for manufacturing a silicon-based micromechanical timepiece part which makes it possible to achieve rapid deposition of thick layers of a suitable material on the silicon.

SUMMARY OF THE INVENTION

To this end, the present invention relates to a method for manufacturing a micromechanical timepiece part starting from a silicon-based substrate, comprising, in order, the steps of:
  a) forming pores on the surface of at least one part of a surface of said silicon-based substrate of a determined depth,
  b) entirely filling said pores with a material chosen from diamond, diamond-like carbon (DLC), silicon oxide, silicon nitride, ceramics, polymers and mixtures thereof, in order to form, in the pores, a layer of said material of a thickness at least equal to the depth of the pores.

The present invention likewise relates to a micromechanical timepiece part which is able to be obtained by the method as defined above.

The present invention likewise relates to a micromechanical timepiece part comprising a silicon-based substrate which has, on the surface of at least one part of one of its surfaces, pores of a determined depth, said pores being filled entirely with a layer of a material chosen from diamond, diamond-like carbon (DLC), silicon oxide, silicon nitride, ceramics, polymers and mixtures thereof, of a thickness at least equal to the depth of the pores.

Advantageously, the timepiece part can comprise a surface layer of said material on the surface of the silicon-based substrate and of the pores filled with the material.

The method according to the invention makes it possible, thanks to preceding formation of pores on the surface of the substrate, to create an actual substrate surface which is very much larger than the initial surface and consequently to increase greatly the apparent deposition rate of a suitable material. Thus, the method according to the invention makes it possible to manufacture, on the surface of the silicon-based substrate, a thick layer of a suitable material in rapid time, greatly reduced relative to deposition on the planar surface of a similar but non-porous substrate.

BRIEF DESCRIPTION OF THE DRAWINGS

The aims, advantages and features of the present invention will appear more clearly in the following detailed description of at least one embodiment of the invention, given solely by way of non-limiting example and illustrated by the appended drawings, in which.

DETAILED DESCRIPTION OF THE INVENTION

Figure 1:
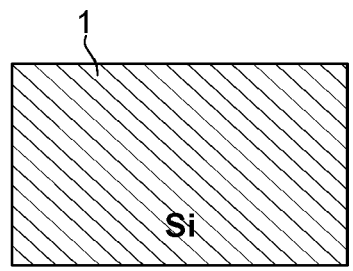
FIGS. 1 to 3 illustrate schematically the steps of a manufacturing method according to the invention.

The method for manufacturing a micromechanical timepiece part starting from a silicon-based substrate according to the invention comprises firstly a step a) of forming pores of a determined depth, starting from the surface of at least one part of a surface of said silicon-based substrate, said pores opening out at the external surface of the silicon-based substrate. The silicon-based substrate is chosen as a function of the micromechanical timepiece part which is to be formed. The final form of the silicon-based substrate as a function of the micromechanical timepiece part which is to be manufactured is given before or after implementation of the method of the invention. In the present invention, the expression « silicon-based substrate » designates both a silicon layer in a substrate and a substrate made of silicon. Preferably, as represented in FIG. 1, the silicon-based substrate 1 is a silicon wafer or an SOI wafer (Silicon-on-Insulator). The pores can be formed both on the surface parallel to the plane of the substrate and on the surface perpendicular to the plane of the substrate.

Advantageously, this step a) can be achieved by a method chosen from the group comprising a method by electrochemical etching, a method of the « Stain-etch » type and a method of the « MAC-Etch » type.

The method by electrochemical etching can be a method by electrochemical anodisation. The implementation thereof requires the use of an electrochemical bath containing hydrofluoric acid in aqueous solution or mixed with ethanol in concentrations of 1 to 10%. An electrical current and electrodes are necessary to create electrochemical conditions causing the etching of the silicon. According to the electrochemical conditions, various types of pores can be obtained. Such a method is known to the person skilled in the art and does not require detailed information here.

The method of the «Stain-etch» type is based on a moist etching of the silicon resulting directly in the formation of porous silicon. Typically, the etching takes place with an $HF/HNO_3/H_2O$ solution with a ratio $HF:HNO_3$ of 50-500:1. This method has the advantage of not requiring an electrical supply in the bath. Such a method is known to the person skilled in the art and does not require detailed information here.

Preferably, step a) is achieved by a method of the «MAC-Etch» type. This method is based on the use of particles of noble metals in order to catalyse local chemical etching reactions. Typically, a very thin layer (10-50 nm) of a noble metal (gold, silver, platinum) is deposited and structured in a random manner or by lift-off, etching, laser etc. For preference, the noble metal is gold. More particularly, there can be used advantageously, particles of gold in solution in an $HF/H_2O_2$ mixture. The size of the particles can be between 5 and 1,000 nm. The structuring can be obtained by lithography of the gold, etching or lift-off. Another option is evaporation or cathodic pulverisation (sputtering) of a very fine, non-closed layer (5-30 nm). A thermal treatment will be able to contribute to the formation of islets of gold.

When the silicon with the layer of noble metal is immersed in an aqueous solution of an $HF/H_2O_2$ mixture, the noble metal locally catalyses the dissolution of the silicon. This etching solution can typically comprise between 4 ml:1 ml:8 ml (48% HF:30% $H_2O_2$:$H_2O$) and 4 ml:1 ml:40 ml (48% HF:30% $H_2O_2$:$H_2O$). The dissolution of the silicon is produced for preference under the metal, the latter penetrating then progressively into the silicon. This reaction can be continued over great depths (>100 µm) according to propagation modes essentially influenced by the orientation of the silicon crystal, the surface disposition, the doping and the chemistry of the bath. The method of the «MAC-Etch» type has the advantage of not requiring an electrical supply in the bath whilst allowing the formation of pores of very great depth (>100 µm) in the silicon. It is therefore particularly suitable for use with SOI wafers as substrate which are generally used for the manufacture of timepiece components.

The person skilled in the art knows the parameters of the methods described above which are to be implemented in order that the pores formed in the silicon-based substrate have a suitable geometry and size.

In particular, the pores can advantageously have an aspect factor (depth:diameter ratio) less than or equal to 100:1. In particular, when step b) is achieved by PVD deposition, the aspect factor of the pores in the silicon-based substrate is preferably less than or equal to 4:1. When step b) is achieved by a CVD or MOCVD deposition (metal organic chemical vapour deposition), the aspect factor of the pores in the silicon-based substrate is preferably less than or equal to 50:1.

Preferably, the pores can have a depth greater than 100 µm, preferably greater than 200 µm and more preferably greater than 300 µm.

Figure 2:
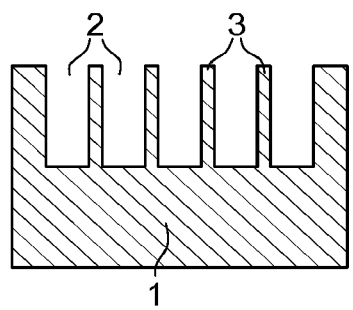

As illustrated in FIG. 2, the formation of pores 2 in the silicon-based substrate 1 over a certain depth causes formation, between the pores 2, of silicon-based pillars 3 over the same depth. Preferably, when considering the silicon-based pillars as having a circular section, the pores 2 are formed so that the projected surface of the silicon-based pillars 3 is less than 79% of the apparent total surface in order not to have silicon-based pillars which are touching, which would rigidify the structure (this corresponds to the percolation threshold).

The second step b) of the method according to the invention consists of filling entirely the pores formed in the silicon-based substrate during step a), with a material chosen from diamond, diamond-like carbon (DLC), silicon oxide, silicon nitride, ceramics, polymers and mixtures thereof, in order to form, in the pores, a layer of said material of a thickness at least equal to the depth of the pores.

This second step b) is effected directly after step a) without any intermediate step so that the material deposited in the pores is in direct contact with the walls of said pores.

Preferably, step b) is achieved by a method chosen from the group comprising methods of thin-film deposition, such as methods of chemical vapour deposition (CVD), physical vapour deposition (PVD), thin atomic layer deposition (ALD) and thermal oxidation. These methods are known to the person skilled in the art and do not require detailed information here. However it can be specified that, for a PVD deposition, the deposition rate will preferably be between 0.1 and 5 nm/s. For a deposition by CVD or MOCVD, the deposition rate will preferably be between 0.01 and 10 nm/s. For a deposition by ALD, the deposition rate will be for example 0.01 nm/s. Furthermore, thermal oxidation is particularly advantageous for reducing the proportion of silicon in a silicon substrate, the silicon being consumed by growth at the rate of approx. 50% of the thickness of the layer. Thus, the person skilled in the art can dimension the pores requiring to be formed in a silicon substrate in order to allow replacement to 100% of the silicon by $SiO_2$, resulting thus in the formation of a very thick layer of $SiO_2$ in a very short space of time.

Figure 3:
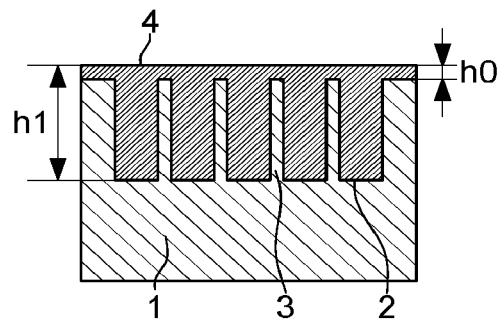

Advantageously, the method according to the invention comprises, after step b), a step c) of forming a surface layer of said material on the surface of the substrate and of the pores filled with the material. More particularly, this surface layer can be obtained by prolonging the deposition of the material according to step b) so as not only to fill the pores 2 entirely with the material but likewise then to deposit said material over the pores 2 filled with the material and also over the pillars 3 in order to form a complete layer 4 of said material of thickness h0, as shown in FIG. 3. A composite layer of thickness h1 comprising pillars 3, pores 2 filled with material and the complete layer 4 is thus obtained. Thus, there can be for example a ratio h0/h1 of the order of 10%.

Hence, the method according to the invention makes it possible to obtain a micromechanical timepiece part comprising a thick composite layer based on deposited silicon/material, or even a thick layer of deposited material when all the silicon has been replaced.

The formation of pores starting from the surface of the substrate during step a) makes it possible to create great corrugation in order to create an actual surface which is far greater than the initial surface without pores. The person skilled in the art can choose the geometry of the pores and also the deposition time of the material in the pores, in order to manufacture, on the surface of the silicon, a thick layer in a greatly reduced time relative to deposition over a planar surface. More particularly, the person skilled in the art can choose the geometry and the size of the pores so as to:
  obtain complete filling of the pores during deposition of the material,
  facilitate the flow of the gases
  obtain the desired ratio of volume between the layer of deposited material and the silicon pores. It is possible for example to manufacture the porous silicon with a porosity of more than 90% if necessary.

For example for certain deposition methods, such as CVD and PVD, the deposition rate is inclined to be slower at the bottom of the pores. It is therefore possible to provide conical pores (wider at the surface than at depth) in order to compensate for this phenomenon associated with the flow of the gases.

Thus, with sufficient gas supply in the pores, the method according to the invention makes it possible to obtain a composite silicon/material layer, deposited with a thickness of h1 in a deposition time close to that necessary for obtaining a complete layer of material of thickness h0 corresponding to the surface layer 4.

The method according to the invention can advantageously be implemented for the manufacture of components of the escapement based on silicon, such as the escapement wheel and the pallets, by forming thick layers of diamond by CVD.

The method according to the invention can likewise be implemented for the manufacture of components of the escapement based on silicon, by forming thick layers of $SiO_2$, almost solid if the method by thermal oxidation is used for the deposition of $SiO_2$.

The method according to the invention can likewise be implemented in order to create rapidly local layers with great thickness in depth in the silicon, by combining it with the structuring of zones made of porous silicon.

What is claimed is:

1. A method for manufacturing a micromechanical timepiece part starting from a silicon-based substrate, comprising, in order:
   forming pores along a surface of said silicon-based substrate of a determined depth,
   filling all of said pores along the surface entirely with a material chosen from diamond, diamond-like carbon (DLC), silicon oxide, silicon nitride, ceramics, polymers and mixtures thereof, in order to form, in the pores, a layer of said material of a thickness at least equal to the depth of the pores, and
   after the filling, forming a complete surface layer of said material on the surface of the silicon-based substrate and of the pores filled with the material to obtain a silicon-based, reinforced micromechanical timepiece part.

2. The method according to claim 1, wherein the forming is achieved by a method chosen from a group comprising a method by electrochemical etching, a method of moist etching silicon and a method of using particles of noble metals.

3. The method according to claim 2, wherein the forming is achieved by the method of using particles of noble metals.

4. The method according to claim 1, wherein the filling is achieved by a method chosen from a group comprising methods of thin-film deposition and thermal oxidation.

5. The method according to claim 1, wherein the pores have an aspect factor (depth:diameter ratio) less than or equal to 100:1.

6. The method according to claim 1, wherein the pores have a depth greater than 100 μm.

7. The method according to claim 6, wherein the pores have a depth greater than 200 μm.

8. The method according to claim 7, wherein the pores have a depth greater than 300 μm.

9. The method according to claim 1, wherein the silicon-based substrate is a silicon wafer or an SOI (Silicon-on-Insulator) wafer.

10. The method according to claim 1, wherein a ratio between a thickness of the complete layer and the depth of the pores is about 10%.

* * * * *